United States Patent [19]

Bachmann et al.

[11] 3,988,172
[45] Oct. 26, 1976

[54] ANNEALING SOLAR CELLS OF INP/CDS

[75] Inventors: Klaus Jurgen Bachmann, Piscataway; Ernest Buehler, Chatham; Joseph Leo Shay, Marlboro; Sigurd Wagner, Holmdel, all of N.J.

[73] Assignee: Bell Telephone Laboratories, Incorporated, Murray Hill, N.J.

[22] Filed: June 16, 1975

[21] Appl. No.: 587,042

[52] U.S. Cl. .............................. 148/1.5; 29/572; 136/89; 148/174; 148/175; 357/16; 357/30
[51] Int. Cl.² .................... H01L 7/00; H01L 31/04
[58] Field of Search ............... 148/1.5, 174, 175; 29/572; 136/89; 357/16, 30

[56] References Cited
UNITED STATES PATENTS

| | | | |
|---|---|---|---|
| 3,492,167 | 1/1970 | Nakayama et al. | 136/89 |
| 3,888,697 | 6/1975 | Bogus | 136/89 |

OTHER PUBLICATIONS

A.Y. Cho & H.C. Casey, Jr., "GaAs–Al$_x$Ga$_{1-x}$As Double Heterostructure Lasers Prepared by Molecular Beam Epitaxy," Applied Physics Letters, vol. 25, No. 5, Sept. 1974, pp. 288–290.

*Primary Examiner*—John H. Mack
*Assistant Examiner*—Aaron Weisstuch
*Attorney, Agent, or Firm*—Bruce S. Schneider

[57] ABSTRACT

Solar cells showing improved efficiency, amounting to about 14 percent for overall solar power conversion, are obtained by annealing InP/CdS solar cells in a slightly reducing atmosphere for about 15 minutes in a temperature range preferably from about 550° centigrade to about 600° centigrade. In an annealing temperature range from 400° centigrade to 625° centigrade, an inversely dependent adjustment of annealing time is found desirable. The atmosphere preferably comprises mainly a substantially inert component and typically comprises an $H_2 + N_2$ mixture, such as forming gas (15% $H_2$ + 85% $N_2$).

10 Claims, 3 Drawing Figures

ANNEALING SOLAR CELLS OF InP/CdS

BACKGROUND OF THE INVENTION

This invention relates to photovoltaic detectors and solar cells. Twenty years after the invention of the silicon solar cell, the photovoltaic solar power plant is still an elusive goal. About two orders of magnitude more capital is required for a silicon power station than for one burning fossil fuel ($0.40 per average watt). At fault are the processing costs resulting from the requirement for high quality bulk material and for shallow p-n homojunctions. Bulk silicon is needed because of the large absorption length (~ 100 µm) in this indirect band-gap material.

Alternatives to silicon involve direct-gap materials with large absorption coefficients. In our copending patent application, Ser. No. 522,060, filed Nov. 8, 1974 and assigned to the assignee hereof, we have disclosed our invention of a solar cell employing a heterojunction of direct-gap indium phosphide (InP) and cadmium sulfide (CdS).

Using the techniques described in that application, we have obtained actual solar efficiencies up to 12.5 percent; but we desire still better results.

SUMMARY OF THE INVENTION

We have discovered that solar cells employing a heterojunction of indium phosphide (InP) and cadmium sulfide (CdS), as disclosed in our above-cited copending patent application, can be improved to about 14 percent efficiency for overall solar power conversion by a brief annealing step.

According to one feature of a process according to our invention, the heterojunction is annealed in a slightly reducing atmosphere for a time period in a range encompassing the time period of 15 minutes and at a temperature in the range from about 400° centigrade to about 625° centigrade. The slightly reducing atmosphere appears to prevent undue increase in the resistivity of the CdS. The physical cause of the efficiency improvement is as yet not established, but is reliably reproducible.

According to a subsidiary feature of our invention, the annealing temperature is preferably in the range from about 550° centigrade to about 600° centigrade. For temperatures below these limits, but within the broader range specified above, the annealing time is desirably adjusted in inverse dependence on the temperature change.

According to still another subsidiary feature of our invention, the slightly reducing atmosphere is preferably a mixture including mainly a substantially inert component and a minor portion of hydrogen. A still more specifically preferred mixture is a mixture of $H_2$ and $N_2$, such as forming gas (15% $H_2$ + 85% $N_2$).

It is one surprising aspect of our invention that even heterojunctions of InP and CdS that appear to be inferior, based on measurements taken across the junction via temporary contact to the CdS, can be improved to 14 percent overall solar efficiency in the finished cell by employing the foregoing annealing procedure.

It is another surprising aspect of our invention that such a short annealing time can have a beneficial effect on such a semiconductive heterojunction. As a consequence, our invention is highly advantageous for the large scale fabrication of solar cells employing InP/CdS heterojunctions.

According to a specific feature of our invention, the potentially most significant value of our annealing process will be obtained by applying it to continuous process fabrication of thin-film, polycrystalline InP/CdS heterojunction solar cells.

A more complete appreciation of our present invention may be apprehended from the following detailed description, taken together with the drawing, in which:

FIG. 1 is a partially pictorial and partially block diagrammatic illustration of a solar cell undergoing processing according to our present invention; and FIGS. 2 and 3 show curves helpful in understanding the operation of our invention.

DETAILED DESCRIPTION

Figure 1:
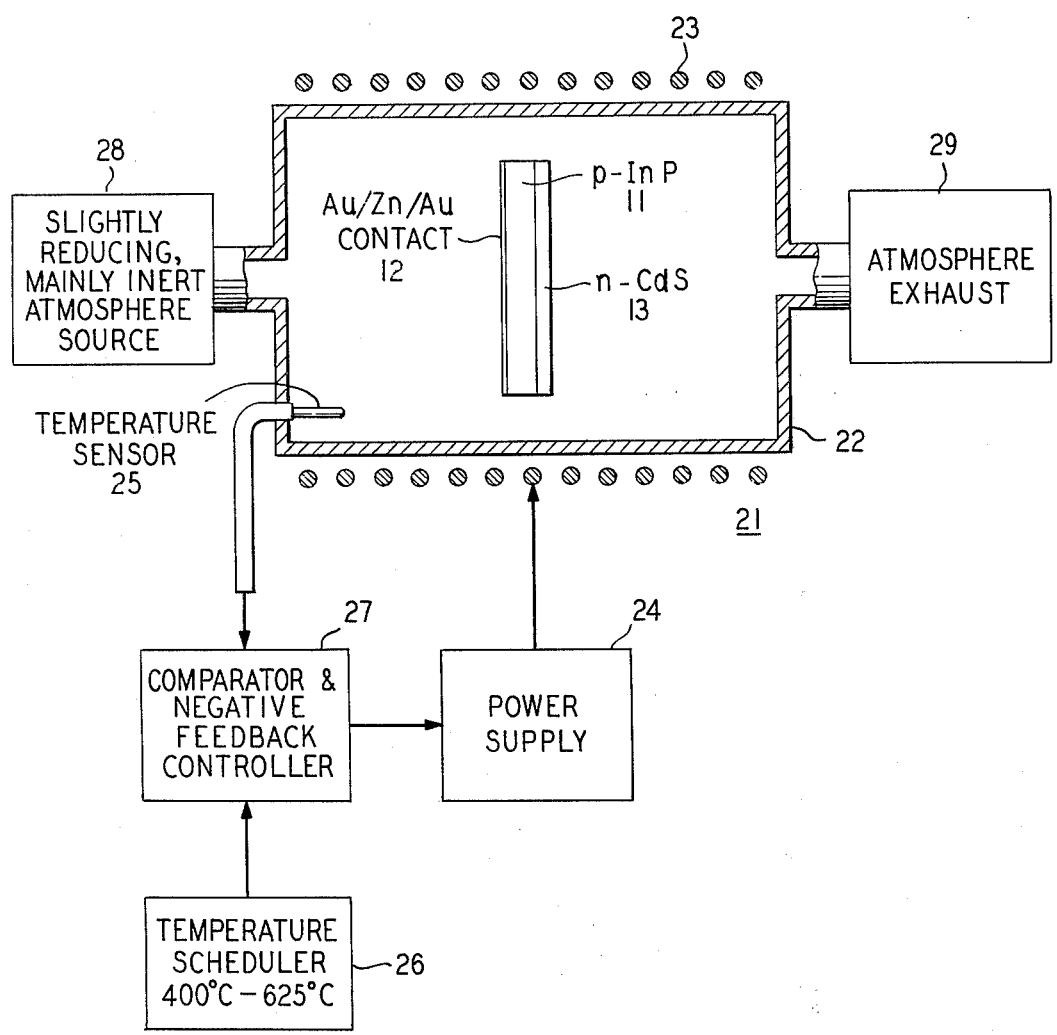

The solar cell undergoing processing in the annealing oven 21 of FIG. 1 will first be described. It includes a p-type InP substrate 11, an n-type CdS layer 13 on substrate 11, and an Au/Zn/Au contact 12 to the InP.

PREPARATION p-InP Substrates - InP substrates for single crystal solar cells are grown by the liquid encapsulant technique. Cd or Zn is added as an acceptor impurity to achieve controlled p-type conductivity. The single crystalline ingot is oriented for cutting (111) wafers, which are then polished with a final Syton polish on one face. The p-type InP portion 11 of the heterodiodes had ~ 2 Ω-cm resistivity. The back contact 12 to the InP side of the final diode can be applied before or after growing the n-type CdS layer 13. When contact 12 is applied before, the Syton polished face is embedded in wax, and three films, i.e., Au, Zn, and Au are successively electrodeposited on the InP. After removal of the wax, and boiling first in acetone, then in methanol, the metallic contact 12 is annealed for ~ 5 minutes at 475° centigrade in forming gas.

When no contact 12 is applied to the InP wafer 11 before the CdS layer 13 growth, the wafer 11 is cleaned after the Syton polishing by boiling in acetone and then in methanol. The InP wafers 11, with or without contact, are now ready for CdS growth. They are immediately mounted, in a laminar flow hood (not shown), on a substrate holder which is then transferred to the CdS growth station. We have also used Syton polished InP wafers 11 which had been slightly etched in cold HCl before a final methanol rinse.

n-CdS Film Growth - The apparatus for CdS growth is a modification of earlier apparatus developed by D. Beecham, Review of Scientific Instruments, Volume 41, page 1654 (1970) and S. Wagner, Applied Physics Letters, Volume 22, page 351 (1973); Journal of Applied Physics, Volume 45, page 246 (1974). After mounting the InP substrate holder therein, the vacuum station used for the growth of CdS films 13 is closed and evacuated with oil-free pumps to a pressure < $1 \times 10^{-5}$ Torr. The coaxial isothermal CdS source (not shown), which contains elemental cadmium and elemental sulfur, is then heated to 350° centigrade. Simultaneously the InP substrate holder is heated to 200° centigrade-250° centigrade. During the heat-up, a shutter separates the source compartment from the substrate.

When source and substrate have reached the set temperature the shutter is opened and a 5 to 10 µm thick n-CdS film 13 is grown on the p-InP wafer 11. The rate of film growth is monitored with a quartz crystal oscillator. It is about 0.15 µm/min. When the desired film thickness has been reached the shutter is closed and both the source and the substrate heaters are turned off. The substrate holder is let cool to room temperature, the vacuum station is filled with nitrogen, opened, and the samples are removed. Samples 11, 13 without Au/Zn/Au contact 12 are waxed with the CdS layer 13 down. Then the contact 12 is made by electroplating, and is sintered as described earlier. On the CdS surface, no contact is illustrated because, in our initial experiments, it was not deposited until the annealing step was completed.

We now described our process for increasing the efficiency of our heterojunction InP/CdS solar cells to 14 percent. This process increases the efficiency of inadvertently inferior cells also to 14 percent. This latter unexpected advantage obviously increases the yield in the production of solar cells and thereby reduces costs. The effectiveness of this process may be of greatest value in some future production of thin-film InP/CdS solar cells by increasing the efficiency of continuous sections to a uniformly high value. Briefly, in one successful experimental example, the process involved annealing an InP/CdS solar cell in "forming gas", (15% $H_2$ + 85% $N_2$) for 15 minutes at 600° centigrade. This temperature is near optimum since lower temperatures are somewhat less effective, and temperatures of 650° centigrade or more catastrophically destroy the cells. Forming gas or a variant thereof ($H_2$ + $N_2$) is essential since annealing in air at these temperatures severely degrades the cell's performance. Slightly lower temperatures and correspondingly longer annealing times should be as effective in increasing the efficiency, although less convenient. Nevertheless, for temperatures from 550° centigrade to 600° centigrade, a 15 minute anneal is approximately sufficient to gain most of the improvement obtainable.

The efficiency of a given InP/CdS solar cell is directly related to its particular current-voltage characteristic as measured in the dark. The previously measured departures of the current density versus voltage curves for our previously disclosed heterodiodes from an ideal shape can be attributed to impurities and defects at the interface between the CdS and the InP. Such defects and associated excess current in the heterojunction region could probably be eliminated by more sophisticated growth procedures in which either the InP substrate was vapor etched or an InP layer (p-type) was deposited, in situ just prior to the CdS growth; but such procedures may be disadvantageous for large scale commercial use. Clearly, there is a variability to the previously measured departures from the ideal; but we have found that all such departures can be greatly reduced by the following processing.

The heterojunction device 11–13 is placed in the annealing oven 21, which includes the air-tight chamber 22, heating coil 23, power supply 24, temperature sensor 25, temperature schedule 26, and comparator and negative feedback controller 27 acting on power supply 24, all of conventional type. To an input port of oven 21 is connected the source 28, which supplies a controlled stream of slightly reducing, mainly inert gas atmosphere, which flows over and around the heterojunction device and out through the output port, which is connected to the atmosphere exhaust 29.

Although oven 21 had a door (not shown), the same process is applicable to a continuous flow assembly line for the heterojunction devices if the assembly line, as described in FIG. 6 of our above-cited copending application, flows into and out of the plane of the paper. The entire assembly line could be made in one air-tight chamber to preserve the integrity of the annealing process.

We have evidence that a slightly reducing i.e., non-oxidizing atmosphere is desirable to the annealing process, because preliminary tests of annealing in air (an oxidizing atmosphere) showed marked increases in CdS resistivity. Such CdS resistivities would lead to excessive internal power dissipation in the solar cells.

EXEMPLARY ANNEALING PROCESS

Figure 2:
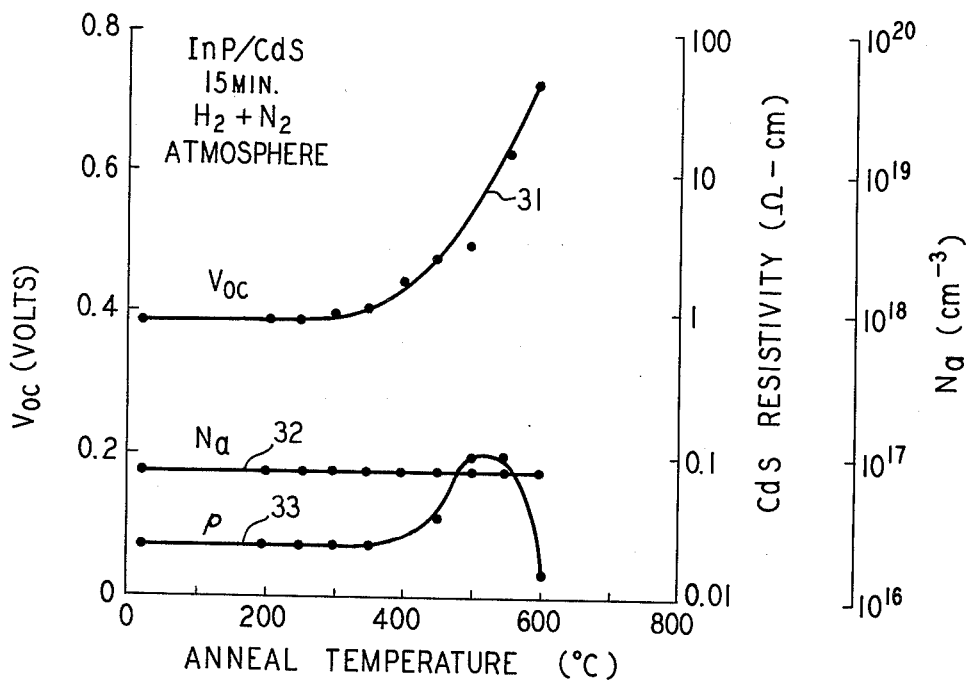

Fortunately such an effect is not observed when the cell is annealed in forming gas as shown in the curves of FIG. 2.

Various runs involved different annealing temperatures, shown in degrees C along the abscissa. Individualized ordinates are shown for each curve, 31, 32, and 33, with appropriate units for open-circuit voltage, $V_{oc}$, acceptor concentration, $N_a$, in the Inp, and CdS resistivity, $\rho$. Although the shape of the curve 33 depicting CdS resistivity, $\rho$, is quite complicated, for all annealing temperatures ≤ 600° C, the resisitivity lies in the interval $0.02 < \rho < 0.10$ Ω-cm and thus lies in the range required for high performance. It can also be seen in FIG. 2, in curve 31, that $V_{oc}$ increases to 0.72 eV subsequent to the 600° C anneal. This open circuit voltage is considerably larger than the best value obtained previously and leads to a calculated solar efficiency of 14 percent for a SiO coated cell. A subsequent anneal at 650° C catastrophically destroyed this cell.

Figure 3:
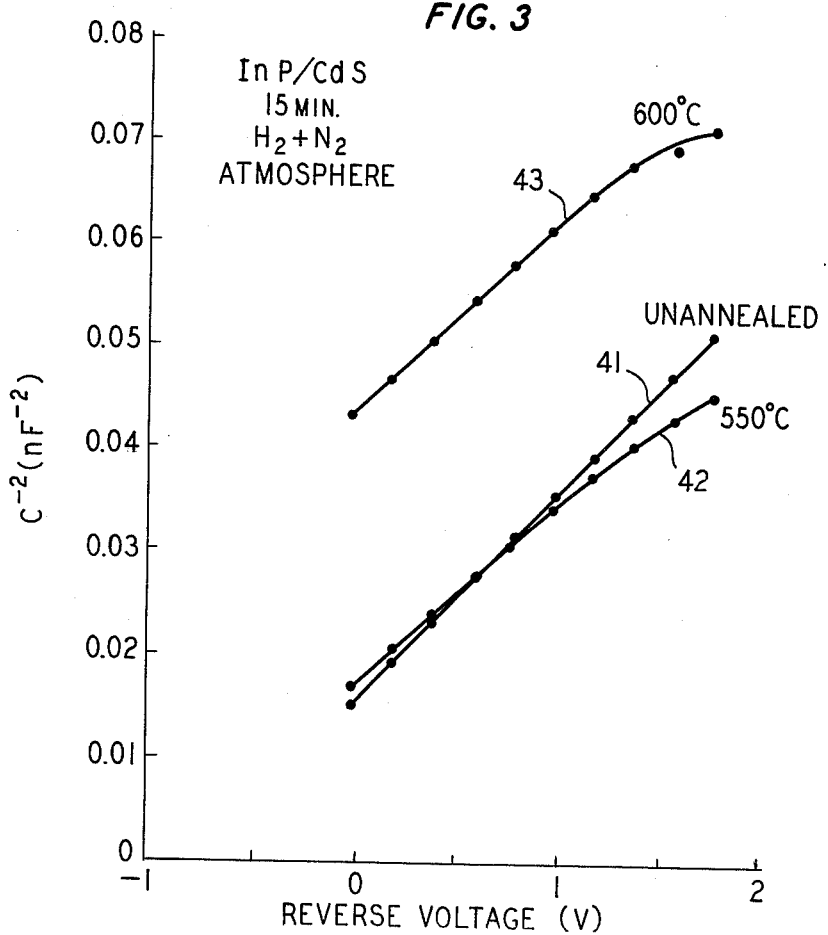

Although a 600° C anneal leads to the maximum solar efficiency, slightly lower temperatures might ultimately prove wiser since at 600° C the metallurgical junction is modified. As shown by the capacitance-voltage characteristics, curve 42 as compared to curve 41, in FIG. 3, the metallurgical junction is essentially unchanged by 15 minute anneals at temperatures ≤ 550° C. The 600° C anneal causes a noticeable change in the junction capacitance, as shown by curve 43, and indicates the formation of a thin resistive layer at the interface.

It is also apparent from this work that InP/CdS solar cells will have quite long useful lifetimes. Although such lifetimes have yet to be measured, it is clear from the 15 minute anneals in an air ambient (not shown), temperatures above 450° C are needed to deteriorate a cell's performance. Therefore, the lifetime will be quite long under operating conditions (T ~ 50° C). Furthermore, should this oxidation of the CdS be the factor ultimately limiting the useful lifetime, an oxygen-impervious encapsulation will lead to much longer lifetimes.

For temperatures below 550° C, it may be desirable to increase the annealing time beyond 15 minutes up to several hours. For temperatures from 600° C to 625° C, times as short as 10 minutes may be desirable. It should also be clear that the amount of hydrogen in the annealing atmosphere may not need to exceed the spurious traces of oxygen in the nitrogen, in the walls of oven 21 and in the surface or near-surface regions of the heterojunction device. Other substantially inert or noble gases may be substituted for the nitrogen. Examples are helium, neon, argon, krypton and xenon.

If an improved ohmic contact for CdS layer 13 is substituted for an indium grid contact, annealing after otherwise complete fabrication of solar cell may become more desirable. An example of one such alternative contact is a layer of chromium.

We claim:

1. A process comprising the steps of fabricating a device having a heterojunction between semiconductive regions of InP and CdS, annealing said device for a selected time at a selected temperature in a non-oxidizing substantially inert atmosphere, said selected temperature being in the range from about 400° centigrade to about 625° centigrade, and completing connections to said device for a desired photovoltaic response.

2. A process according to claim 1 in which the selected time is in the range from 10 minutes to several hours, the shorter times corresponding to the higher annealing temperatures.

3. A process according to claim 1 in which the selected time approximates 15 minutes.

4. A process according to claim 3 in which the selected temperature is in the range from about 550° centigrade to about 600° centigrade.

5. A process according to claim 1 in which the atmosphere includes a mixture of a first substantially inert component and a second component consisting essentially of hydrogen.

6. A process according to claim 5 in which the first component is nitrogen.

7. A process according to claim 1 in which the atmosphere comprises forming gas.

8. A process for improving the performance of a heterojunction photovoltaic device, comprising the steps of fabricating a device to include a heterojunction between regions of InP and CdS, said device to be without an ohmic contact to the CdS, placing the device in an apparatus which can be temperature controlled and through which a gas ambient can be flowed, controlling the temperature of said apparatus and said device to be in the range between approximately 400° centigrade and approximately 600° centigrade, flowing non-oxidizing gas atmosphere of an otherwise substantially inert nature through said apparatus over said device, and removing said device from said apparatus after the continuation of said controlling and flowing steps for about 10 minutes to several hours in inverse dependance upon the temperature of said controlling step.

9. A process according to claim 8 in which the controlling step controls the temperature to be between about 550° centigrade and about 600° centigrade, and in which the device is removed after about 15 minutes in said apparatus.

10. A process according to claim 8 including an additional subsequent step of supplying an ohmic contact to the CdS region.

* * * * *

UNITED STATES PATENT AND TRADEMARK OFFICE
CERTIFICATE OF CORRECTION

PATENT NO. : 3,988,172

DATED : October 26, 1976

INVENTOR(S) : Klaus J. Bachmann, Ernest Buehler, Joseph L. Shay, Sigurd Wagner

It is certified that error appears in the above–identified patent and that said Letters Patent are hereby corrected as shown below:

Column 2, line 29, the word "back" should have quotation marks around it; line 38, change "wafter" to --wafer--.
Column 4, line 21, change "Inp" to --InP--.
Column 5, line 6, after "CdS," insert --and--; line 11, after "centigrade" delete the rest of the sentence.
Column 6, line 14, after "flowing" insert --a--.

Signed and Sealed this

Fifth Day of April 1977

[SEAL]

Attest:

RUTH C. MASON
Attesting Officer

C. MARSHALL DANN
Commissioner of Patents and Trademarks